United States Patent

[11] 3,586,929

[72] Inventors Jurgen Burmeister;
Gerd Anton Schiefer, both of Aachen, Germany

[21] Appl. No. 810,947
[22] Filed Mar. 27, 1969
[45] Patented June 22, 1971
[73] Assignee U. S. Philips Corporation
New York, N.Y.

[54] SEMICONDUCTOR DEVICE HAVING TWO VARICAP DIODES ARRANGED BACK TO BACK
9 Claims, 6 Drawing Figs.

[52] U.S. Cl. .......... 317/235, 317/234
[51] Int. Cl. .......... H01l 5/00
[50] Field of Search .......... 317/234, 235

[56] References Cited
UNITED STATES PATENTS

| | | | |
|---|---|---|---|
| 2,878,152 | 3/1959 | Runyan et al. .......... | 317/235 X |
| 3,145,328 | 8/1964 | Letaw .......... | 317/234 |
| 3,192,083 | 6/1965 | Sirt' .......... | 317/235 X |
| 3,201,664 | 8/1965 | Adam .......... | 317/234 |
| 3,362,858 | 1/1968 | Knopp .......... | 317/235 |

*Primary Examiner*—James D. Kallam
*Attorney*—Frank R. Trifari

ABSTRACT: Two varicap diodes are integrated into a common semiconductor body by preferably epitaxial techniques. The structure comprises a middle region of high conductivity flanked on two sides by opposite type regions of lower conductivity, in turn flanked by contact regions of high conductivity. Connections are made to the middle region and the contact regions.

PATENTED JUN 22 1971 3,586,929

INVENTORS
JÜRGEN BURMEISTER
GERD A. SCHIEFER
BY
AGENT

SEMICONDUCTOR DEVICE HAVING TWO VARICAP DIODES ARRANGED BACK TO BACK

The invention relates to a semiconductor device having two varicap diodes the PN junctions of which are arranged back to back, a bias voltage being applied in the reverse direction across the two PN junctions.

Semiconductor devices employing circuits of the said type are known and are used inter alia for tuning oscillatory circuits. Generally two varicap diodes are used which are arranged in separate envelopes and are arranged back to back, the required bias voltage being applied through the conductor connecting the two diodes.

Said varicap diodes fulfill the requirement that on the one hand a high capacity ratio $C_{max} : C_{min}$ is achievable, while on the other hand the quality of said diodes is high from a point of view of circuit technology.

When the capacity of the envelope and the inductance of the diode and the supply wires is left out of consideration, such a varicap diode may be considered to be constructed from the parallel arrangement of the diode capacity $C_r$ and of the resistance $R_p$ of the depletion layer, which parallel arrangement is itself connected in series with a series resistance $R_s$ which is constituted by contact and bulk resistances. The Q factor of the varicap diode is composed of the series quality $Q_s = 1/\omega R_s C_r$ and the parallel quality $Q_p = \omega R_p C_r$ according to the formula $$Q = \frac{Q_D Q_s}{Q_D + Q_s} = \frac{R_D}{R_s} \cdot \frac{\omega R_2 C_v}{1 + \omega^2 R_D R_s C_v^2} \qquad (1)$$

in which formula $\omega$ is the circuit frequency of the signal voltage.

$R_p$ is generally very large so that on an approximation $Q = Q_s = 1/\omega R_s C_r$ (2)

Consequently, the Q-factor of the varicap diode can in practice be increased only by decreasing the series resistance. This series resistance $R_s$ in, for example, a normal $p^+—n—n^+$ silicon structure, which consists of an $n^+$ substrate, an epitaxial $n$ layer and a $p$-region diffused in that layer, may be deemed to be constructed from the following contributions:

$R_1$ = contact resistance connection conductor to $p+$ silicon,
$R_2$ = contact resistance connection conductor to $n+$ silicon.
$R_3$ = bulk resistance of the $p+$ layer.
$R_4$ = bulk resistance of the $n+$ layer.
$R_5$ = bulk resistance of the $n$ layer.

The bulk resistance $R_5$ which depends upon the width of the depletion layer can hardly be influenced or cannot at all be influenced so that a reduction of the series resistance is achievable only by reducing one or more of the components $R_1$ to $R_4$.

One of the objects of the invention is to reduce considerably the series resistance of the varicap diode in a circuit arrangement of the type described.

The invention is inter alia based on the recognition of the fact that by providing the varicap diode in the same semiconductor body a structure can be realized by which the quality of the varicap diodes is considerably increased.

According to the invention, a semiconductor device of the type mentioned in the preamble is therefore characterized in that the device comprises a monocrystalline semiconductor body having successively a first, a second and a third region of alternate conductivity types, which regions are separated from each other by the said PN junctions and are each provided with a connection contact which is connected to a connection conductor, the second region being doped higher than the first and the third regions.

The use of the invention results inter alia in the following advantages:

1. With respect to high frequencies only two contact resistances are present in the circuit arrangement according to the invention, while in the conventional circuit arrangement having two separate varicap diodes there are four contact resistances;
2. A bulk resistance between the two PN junctions is considerably reduced as compared with the known circuit arrangements;
3. The capacity of the envelope can be kept smaller.

According to a preferred embodiment of the invention the PN junctions are arranged in the body so that they are situated opposite to each other in substantially parallel surfaces as a result of which the bulk resistance between the two PN junctions is even further reduced.

According to a further embodiment of the invention the connection contacts on the first and the third region are constituted in a simple manner by a fourth region provided on the first region and a fifth region provided on the third region, respectively, said fourth and fifth regions being of the same conductivity type as the first and the third regions but being higher doped so that very low contact resistances can be obtained in a simple manner.

According to another important preferred embodiment the doping of the first region is substantially equal to that of the third region so that two symmetrical varicap diodes are obtained.

The invention is of particular advantage in embodiments in which the second region has $p$-type conductivity. Actually it has been found that the contact resistance on $p$-conductive material, particularly on $p$-conductive silicon, is very hard to reduce to a sufficiently low value in the conventional circuits for high frequency. In the device according to the invention the connection contact on the second region is used only for applying the bias voltage, and the relative contact resistance hence exerts substantially no influence in relation to the high frequency signal voltage.

According to a further important preferred embodiment a semiconductor device according to the invention comprises a semiconductor body which consists of an epitaxial layer structure grown on a substrate. Such an epitaxial structure is particularly advantageous because the desired doping profile can be obtained in a comparatively simple manner by means of epitaxial methods.

According to another preferred embodiment of the invention the semiconductor body comprises a substrate of one conductivity type, the second region, in which substrate two cavities are provided on one surface beside each other, said cavities containing the first, third, fourth and fifth regions in the form of epitaxial layers, one cavity on the substrate successively containing the first and fourth regions and the second cavity containing successively the third and the fifth regions, the surfaces of the fourth and fifth regions being situated substantially in one plane with the said surface of the substrate.

According to the invention, a further important preferred embodiment is characterized in that the semiconductor body comprises a substrate of the first conductivity type, the said fourth region, on which epitaxial layers of successively the first, the second, the first and again the first conductivity type are provided which constitute the said first, second, third and fifth regions, respectively. The third and fifth regions are preferably provided only on a part of the surface of the layer which constitutes the second region, a connection contact being provided on the exposed part of the surface of said layer.

The third and the fourth layer may be provided on the whole surface of the second layer, after which a part of the third and the fourth layer is removed mechanically and/or chemically until a part of the second layer is exposed. Alternatively, in circumstances the second layer, after growing, may advantageously be coated with a masking layer which prevents a further epitaxial growth or at least reduces it, for example, a silicon oxide layer, after which a part of said masking layer is removed while using conventional photolithographic methods, and the third and the fourth layer are allowed to grow on the exposed part of the second layer after which the masking layer is removed and the connection conductors are provided.

The semiconductor device may be manufactured from various semiconductor materials. Preferably the semiconductor body consists of silicon, germanium or gallium arsenide, which materials have very favourable electric and technical properties for the manufacture of varicap diodes.

In order that the invention may be readily carried into effect, two examples thereof will now be described in greater detail, by way of example, with reference to the accompanying drawing, in which:

FIG. 1 diagrammatically shows the circuit diagram of a semiconductor device according to the invention.

For clearness' sake the figures are not drawn to scale, particularly as regards the thickness dimensions.

Figure 1:
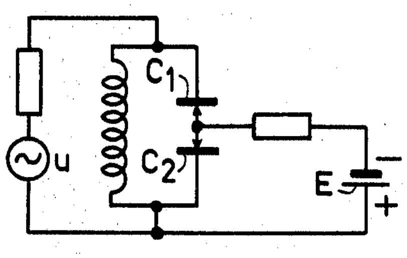

FIG. 1 shows a semiconductor device having two varicap diodes $C_1$ and $C_2$, the PN junctions $J_1$ and $J_2$, respectively (see FIG. 2), are arranged back to back, a bias voltage being applied in the reverse direction across each of the two PN junctions by the voltage source E having a high internal resistance.

Figure 2:
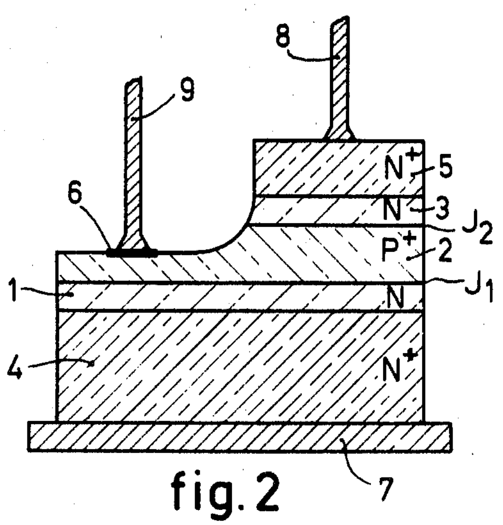
FIG. 2 is a diagrammatic cross-sectional view of a semiconductor device according to the invention in as far as it relates to the semiconductor body and the connection conductors provided thereon.

FIG. 2 is a cross-sectional view through the semiconductor body and the connection conductors of the device provided thereon. The semiconductor body consists of a monocrystalline epitaxial layer structure of silicon having successively a first region 1 (see FIG. 2) of *n*-conductive silicon with an average resistivity of 0.61 ohm cm. and a thickness of 4 $\mu$m., a second region 2 of *p*-conductive silicon having a resistivity of 0.05 ohm cm., and a third region 3 of *n*-conductive silicon and an average resistivity of 0.62 ohm cm., while a fourth and fifth region 4 and 5, respectively, are provided as connection contacts which are both of the *n* type and have resistivities of 0.005 ohm cm. The regions 2 and 3 are separated from each other by the PN junctions $J_1$ and $J_2$, respectively, which are situated in substantially parallel planes opposite to each other and constitute the varicap diodes $C_1$ and $C_2$, respectively (see FIG. 1). A connection contact 6 is provided on the region 2 and the connection contacts 4, 5 and 6 are connected to connection conductors 7, 8 and 9, respectively. The connection conductors 8 and 9 consist of supply wires, while the connection conductor 7 is constructed in the form of a metal baseplate to which the semiconductor body is soldered. The regions 3 and 5 are provided only on a part of the surface of the region 2 so that said region 2 can easily be contacted on the exposed part.

It appears from the figures that for the high frequency signal voltage U (see FIG. 1) only two contact resistances (8, 5) and (7, 4) are of importance. These contact resistances in the conventional $p^+nna0$?-capacity diodes are in the order of magnitude of a few tenths of an ohm per diode with a PN-junction surface of $4.10^{14}$ sq. cm. In the embodiment according to the invention the overall contact resistance hence is strongly reduced while simultaneously the bulk resistance in the *p*-region is approximately halved.

The device shown in FIG. 2 may be manufactured as follows, for example, according to a controlled epitaxial method described by Jackson, "Transactions of the Metallurgical Society of AIME," volume 233, March, 1965, pp. 596—602. Starting material is an *n*+ substrate in the form of a silicon disc, diameter approximately 30 mms., resistivity 0.005 ohm/cm., thickness 150 $\mu$m. A plurality of semiconductor devices according to the invention can be manufactured on said disc. For simplification, the manufacture will hereinafter be described with reference to one single element, the various operations being always applied to the whole disc. An *n*-conductive layer having a doping profile which corresponds to the desired capacity-bias characteristic and an average resistivity of 0.62 ohm cm. and an average concentration of approximately $10^{16}$ donor atoms per cm. is allowed to grow, to a thickness of 4 $\mu$m., on the substrate at approximately 1050° C. by thermal decomposition of $SiCl_4$ with accurately dosed addition of $AsH_3$, the doping concentration of said layer being smaller everywhere than $3\times10^{18}$ at./cm.$^3$. The supply of $AsH_3$ is then discontinued and $B_2H_6$ is added to the gas current after which a *p*-conductive layer, 10 $\mu$m. thickness, having a concentration of approximately $3.5\times10^{18}$ at./cm.$^3$and a resistivity of 0.05 ohm cm., then again a 4 $\mu$m. thick conductive layer, average resistivity 0.62 ohm cm. as described above, and finally a 10 $\mu$m. thick *n*-conductive layer, resistivity 0.005 ohm cm. (concentration approximately $10^{19}$ at./cm.$^3$) is provided by growing. Each device is then covered approximately half with a photoetching mask while using photolithographic etching methods commonly used in semiconductor technology. The silicon is then removed to a depth of approximately 16 $\mu$m. by etching with a $HNO_3$—HF mixture, after which by means of a further photolithographic etching method an aluminum layer is provided on the places to be contacted. The devices, which each have dimensions of approximately 300×3 00 $\mu$m., are finally separated from each other, provided with supply wires by thermal bonding, and sealed in an envelope.

Figure 3:
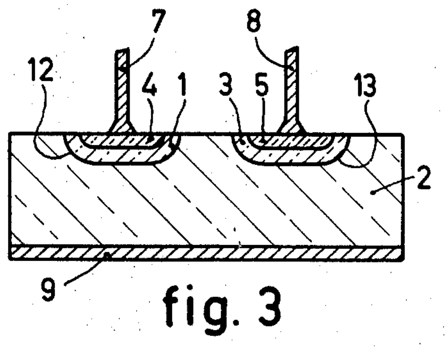
FIG. 3 is a diagrammatic cross-sectional view of another semiconductor device according to the invention.
Figure 4:
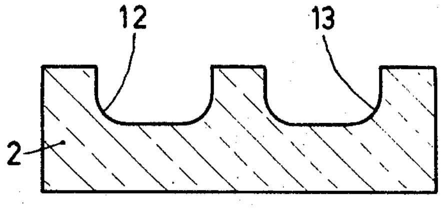
FIGS. 4 to 6 are diagrammatic cross-sectional views of the device shown in FIG. 3 in successive stages of manufacture.
Figure 5:
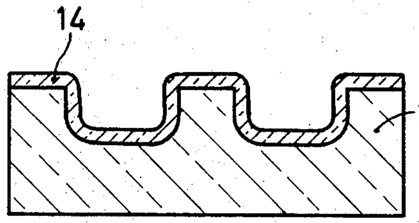
Figure 6:
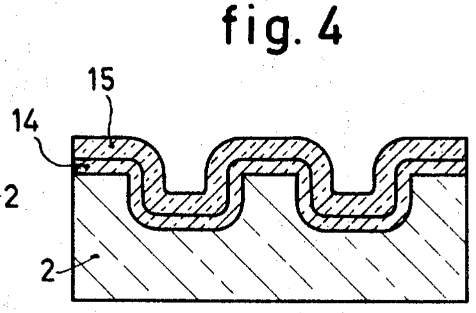

FIG. 3 is a cross-sectional view of another embodiment of a semiconductor device according to the invention. In the FIGS. 3 to 6 corresponding components are referred to by the same reference numerals as in FIG. 2. The semiconductor body comprises a substrate of *p*-type silicon which constitutes the said second region and comprises at a surface 11 beside each other two cavities 12 and 13 (see FIG. 3). Each of these cavities comprises an epitaxial *n*-type silicon layer 1 and 3, respectively, which constitute the first and the third region, respectively, on which layers 1 and 3 furthermore the more strongly doped *n*+ layers 4 and 5, respectively, are provided which constitute the fourth and fifth regions, respectively. The surfaces of the layers 4 and 5 are situated substantially in one plane with the surface 11. Connection conductors 9, 7 and 8 are provided on the regions 2, 4 and 5. The conductor 9 may alternatively be provided, if desirable, on the surface 11 so as to obtain a one-sided contacted planar device.

The device shown in FIG. 3 can be manufactured by using the same method as described in the preceding example. According to a method described in Swiss Patent Specification 445,643 a substrate 2 of *p*-conductive silicon, resistivity 0.05 ohm cm., thickness 150 $\mu$m., may be used as the starting material in which (see FIG. 4) cavities 12 and 13 each having a depth of 10 $\mu$m. are provided on one surface beside each other by means of an etching and/or mechanical method. By means of the above-described controlled epitaxial method an *n*-conductive layer 14 the doping profile of which has an average resistivity of 0.62 ohm cm. is grown on this substrate 2 to a thickness of 4 $\mu$m., the structure of FIG. 5 being obtained on which furthermore an approximately 10 $\mu$ thick *n*+ conductive layer 15 of 0.005 ohm cm. is grown. The resulting structure (see FIG. 6) is then grounded down on one side of the grown epitaxial layers, the structure shown in FIG. 3 being obtained which is provided with the connection conductors 7, 8 and 9.

In this device the bulk resistance in the region 2 is larger than in the device shown in FIG. 2. However, it has the advantage that the manufacture of the fully symmetrical $n^+npnn^{+BQL}$ and $p^+pnpp^+$ structure is possible with only two epitaxial growings.

It is obvious that the invention is not restricted to the examples described but that many variations are possible to those skilled in the art without departing from the scope of the present invention. For example, other methods may be used and notably in the first example the second layer, after it has been grown epitaxially, may in circumstances be covered advantageously with a masking layer which prevents or at least decreases a further epitaxial growth, for example, a silicon oxide layer, after which a part of said masking layer is removed and the third and fourth layers are provided by growing on the exposed part of the second layer after which the masking layer is removed. Furthermore, epitaxial layers having different doping profiles may be used in accordance with the requirements imposed upon the capacities. As a substrate in the first example the second region may be used instead of the fourth region, the layer being grown on the two main surfaces of the second region. By interchanging *n* and *p* doping, devices may also be manufactured which, as regards doping, are complementary to the examples described.

What we claim is:

1. A semiconductor device comprising two varicap diodes having back-to-back PN junctions, comprising a monocrystalline semiconductor body having successively arranged first, second, and third regions with the second region of one type and the first and third regions of the opposite type conductivity forming two PN junctions, said second region having a higher impurity dopant concentration and a higher conductivity than that of the first and third regions, and separate low resistance electrical connections to the first, second, and third regions.

2. A semiconductor device as set forth in claim 1 and including means for applying to the connections to the first, second and third regions bias voltage such as to bias both PN junctions in the reverse direction.

3. A semiconductor device as set forth in claim 2 wherein the PN junctions are located in substantially parallel planes.

4. A semiconductor device as set forth in claim 2 wherein the second region is *p*-type, and the first and third regions are *n*-type and of substantially the same conductivity.

5. A semiconductor device as set forth in claim 2 wherein the semiconductor is selected from the group consisting of silicon, germanium, and gallium arsenide.

6. A semiconductor device as set forth in claim 2 wherein the second region is thicker than the first and third regions.

7. A semiconductor device as set forth in claim 2 wherein the connection to the first region comprises a fourth region of opposite type material and the connection to the second region comprises a fifth region of opposite type material, both the fourth and fifth regions having a higher conductivity than the first and third regions.

8. A semiconductor device as set forth in claim 7 wherein the semiconductor body comprises the fourth region as a substrate, and the first, second, third, and fifth regions as successively arranged grown epitaxial layers on the fourth region.

9. A semiconductor device as set forth in claim 7 wherein the semiconductor body comprises the second region as a substrate, the first and third regions as parts of a first grown epitaxial layer on the second region, and the fourth and fifth regions as parts of a second grown epitaxial layer in the first layer.

UNITED STATES PATENT OFFICE
CERTIFICATE OF CORRECTION

Patent No. 3586929 Dated June 22, 1971

Inventor(s) JURGEN BURMEISTER and GERD ANTON SCHIEFER

It is certified that error appears in the above-identified patent and that said Letters Patent are hereby corrected as shown below:

Column 1, line 20, "$C_r$" should read -- $C_v$ --;

line 25, "$C_r$" should read -- $C_v$ --;

line 30 (in the formula) "$R_2$" should read -- $R_s$ --;

line 34 (in the formula) "$C_r$" should read -- $C_v$ --.

Column 3, line 44, "baseplate" should read -- base plate --;

line 51, "p+nna0?" should read -- p+nn+ --;

line 53, "$4.10^{14}$" should read -- $4.10^{-4}$ --.

Column 4, line 57 (in the formula) cancel $^{+BQ1}$.

Signed and sealed this 28th day of December 1971.

(SEAL)
Attest:

EDWARD M.FLETCHER,JR.
Attesting Officer

ROBERT GOTTSCHALK
Acting Commissioner of Patents

FORM PO-1050 (10-69)

USCOMM-DC 60376-P69
☆ U.S. GOVERNMENT PRINTING OFFICE : 1969 O—366-334

PO-1050
(5/69)

UNITED STATES PATENT OFFICE
CERTIFICATE OF CORRECTION

Patent No. 3586929 Dated June 22, 1971

Inventor(s) JURGEN BURMEISTER & GERD ANTON SCHIEFER

It is certified that error appears in the above-identified patent and that said Letters Patent are hereby corrected as shown below:

Title Page, Col. 1, there should have been added a line indicating the applicant's assertion of the right of priority based upon the corresponding German application Serial No. P1764125.7 filed April 5, 1968.

Signed and sealed this 2nd day of May, 1972.

(SEAL)
Attest:

EDWARD M.FLETCHER,JR.
Attesting Officer

ROBERT GOTTSCHALK
Commissioner of Patents